United States Patent
Patel et al.

(10) Patent No.: US 10,326,431 B1
(45) Date of Patent: Jun. 18, 2019

(54) LEVEL SHIFTER CIRCUIT TO MINIMIZE DUTY-CYCLE DISTORTION ON CLOCK PATHS

(71) Applicant: QUALCOMM Incorporated, San Diego, CA (US)

(72) Inventors: Pratik Rajeshbhai Patel, Bangalore (IN); Percy Tehmul Marfatia, Bangalore (IN); Rajagopal Narayanan, Bangalore (IN)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/941,055

(22) Filed: Mar. 30, 2018

(51) Int. Cl.
| | |
|---|---|
| H03K 19/082 | (2006.01) |
| H03K 3/356 | (2006.01) |
| H03K 19/0185 | (2006.01) |

(52) U.S. Cl.
CPC .......... *H03K 3/356113* (2013.01); *H03K 19/018521* (2013.01)

(58) Field of Classification Search
CPC ... H03K 19/018521; H03K 19/018528; H03K 3/356113; H03K 19/00315; H03K 19/00361; H04L 25/028; H04L 25/0272; G11C 8/08; G11C 5/145; G11C 7/12
See application file for complete search history.

(56) References Cited

U.S. PATENT DOCUMENTS

| | | | |
|---|---|---|---|
| 7,173,472 B2 * | 2/2007 | Chen | H03K 19/0027 326/81 |
| 7,511,552 B2 * | 3/2009 | Ali | H03K 3/012 326/62 |
| 9,024,675 B2 | 5/2015 | Sul et al. | |
| 9,577,616 B2 | 2/2017 | Moore et al. | |
| 9,755,621 B1 | 9/2017 | Sinha et al. | |
| 2008/0232168 A1 * | 9/2008 | Maejima | G11C 5/147 365/185.17 |
| 2017/0149434 A1 | 5/2017 | Bianchi et al. | |
| 2017/0250689 A1 | 8/2017 | Kitagawa | |

* cited by examiner

*Primary Examiner* — Long Nguyen
(74) *Attorney, Agent, or Firm* — Qualcomm Incorporated

(57) ABSTRACT

A novel clock level-shifter to reduce duty-cycle distortion across wide input-output voltage operating range is disclosed. In some implementations, a level shifter includes an input stage coupled to a first power supply to receive an input signal, an output stage coupled to a second power supply to generate an output signal, and a first switch coupled directly between the output stage and the second power supply, wherein the input signal turns on or off the first switch. In some implementations, the first switch has a gate, a source, and a drain, the source being coupled to the second power supply, the drain being coupled to the output stage, and the gate being driven directly by the input signal.

13 Claims, 5 Drawing Sheets

LEVEL SHIFTER CIRCUIT TO MINIMIZE DUTY-CYCLE DISTORTION ON CLOCK PATHS

FIELD OF DISCLOSURE

Aspects of the present disclosure relate generally to semiconductor circuit design, and more particularly to a novel level shifter to reduce duty-cycle distortion across wide input-output voltage operating range.

BACKGROUND

A level shifter is used to convert an input logic voltage from a first power domain to a second power domain. In some cases, the first power domain has logic voltage levels that are smaller than the logic voltage levels of the second power domain. Likewise, the power supply or voltage supply of the first power domain is lower than the power supply or voltage supply of the second power domain. In other cases, the first power domain has logic voltage levels that are greater than the logic voltage levels of the second power domain. Likewise, the power supply or voltage supply of the first power domain is higher than the power supply or voltage supply of the second power domain in such a case.

Level shifters are widely used in today's semiconductor circuits. Level shifters are particularly useful in complex semiconductor designs, such as system on a chip (SoC), where signals are often routed through multiple power domains across the chip. Level shifters are used extensively to transition signals from one power domain to another power domain. At the same time, the requirement on the performance of level shifters has also been raised due to more stringent signal integrity requirement in low power circuits and the push for faster speed. The ability to maintain signal integrity, especially on clock signals, across wide range of input-output voltage is crucial in today's low-power high-speed mobile chips. Conventional level shifters that are susceptible to duty cycle distortion cannot meet the requirement of many low-power high-speed applications.

Accordingly, there is a need in the art for level shifters with minimal duty cycle distortion across a wide range of input-output voltage.

SUMMARY OF THE DISCLOSURE

The following presents a simplified summary of one or more implementations to provide a basic understanding of such implementations. This summary is not an extensive overview of all contemplated implementations, and is intended to neither identify key or critical elements of all implementations nor delineate the scope of any or all implementations. The sole purpose of the summary of the disclosure is to present some concepts of one or more implementations in a simplified form as a prelude to the more detailed description that is presented later.

Some implementations of a level shifter to reduce duty cycle distortion have been disclosed. In some implementations, a level shifter includes an input stage coupled to a first power supply to receive an input signal, an output stage coupled to a second power supply to generate an output signal, and a first switch coupled directly between the output stage and the second power supply, wherein the input signal turns on or off the first switch. In some implementations, the first switch has a gate, a source, and a drain, the source being coupled to the second power supply, the drain being coupled to the output stage, and the gate being driven directly by the input signal. In some implementations, the first power supply is lower than the second power supply.

In some implementations, the first switch may be a p-type transistor. Furthermore, the output stage can comprise a second p-type transistor having a gate, a source, and a drain, the source of the second p-type transistor coupled to the drain of the first p-type transistor, and a first n-type transistor having a gate, a source, and a drain, the gate of the first n-type transistor coupled to the gate of the second p-type transistor, and the drain of the first n-type transistor coupled to the drain of the second p-type transistor. The first switch can be configured to turn on and to cause the second p-type transistor to start charging in response to the input signal going high.

In some implementations, the level shifter further includes a latch coupled between the input stage and the output stage, and a bypass switch coupled between the output stage and the latch, wherein the bypass switch is turned on or off in response to a delayed version of the input signal. In some implementations, the bypass switch has a gate, a source, and a drain, the drain being coupled to the second power supply, the source being coupled to an input of the output stage, and the gate being coupled to the latch.

In some implementations, the input stage of the level shifter comprises a first inverter having an input and an output, wherein the input is configured to receive the input signal, and a second inverter having an input and an output, wherein the input of the second inverter is coupled to the output of the first inverter, and the output of the second inverter is coupled to the gate of the bypass switch. In some implementations, the bypass switch comprises an n-type transistor.

Some implementations of a method to level shift an input signal from a first power domain to a second power domain is disclosed. The method can comprise receiving the input signal at an input stage in the first power domain associated with a first power supply, generating an output signal at an output stage in the second power domain associated with a second power supply, and using the input signal to directly control a first switch in the output stage to enhance discharging of a source of a first pull-up transistor of the output stage.

In some implementations, the first switch comprises a p-type transistor having a gate, a source, and a drain, and using the input signal to directly control the first switch comprises applying the input signal to the gate of the p-type transistor. Furthermore, the method may comprise coupling the source of the p-type transistor to the second power supply.

In some implementations, the method further comprises providing a latch in the second power domain to store a value corresponding to the input signal, and using a delayed version of the input signal to control a bypass switch to initiate charging of a gate of the first pull-up transistor of the output stage. The first power supply may be lower than the second power supply.

Some implementations of a level shifter to reduce mismatch of rise and fall delay have been disclosed. In some implementations, the level shifter comprises an input stage coupled to a first power supply to receive an input signal, an output stage coupled to a second power supply to generate an output signal, and means for reducing mismatch of rise delay and fall delay between the input signal and the output signal.

In some implementations, the means for reducing mismatch of the rise delay and the fall delay between the input signal and the output signal comprises a first switch having a gate, a source, and a drain, the source being coupled to the second power supply, the drain being coupled to the output stage, and the gate being driven directly by the input signal. The level shifter may further include a latch coupled between the input stage and the output stage.

In some implementations, the means for reducing mismatch of the rise delay and the fall delay between the input signal and the output signal comprises a bypass switch coupled between the output stage and the latch, wherein the bypass switch is turned on or off in response to a delayed version of the input signal.

To the accomplishment of the foregoing and related ends, the one or more embodiments include the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the description embodiments are intended to include all such aspects and their equivalents.

BRIEF DESCRIPTION OF THE DRAWINGS

Implementations of the present disclosure and their advantages are best understood by referring to the detailed description that follows. It should be appreciated that like reference numerals are used to identify like elements illustrated in one or more of the figures.

DETAILED DESCRIPTION

Figure 1:
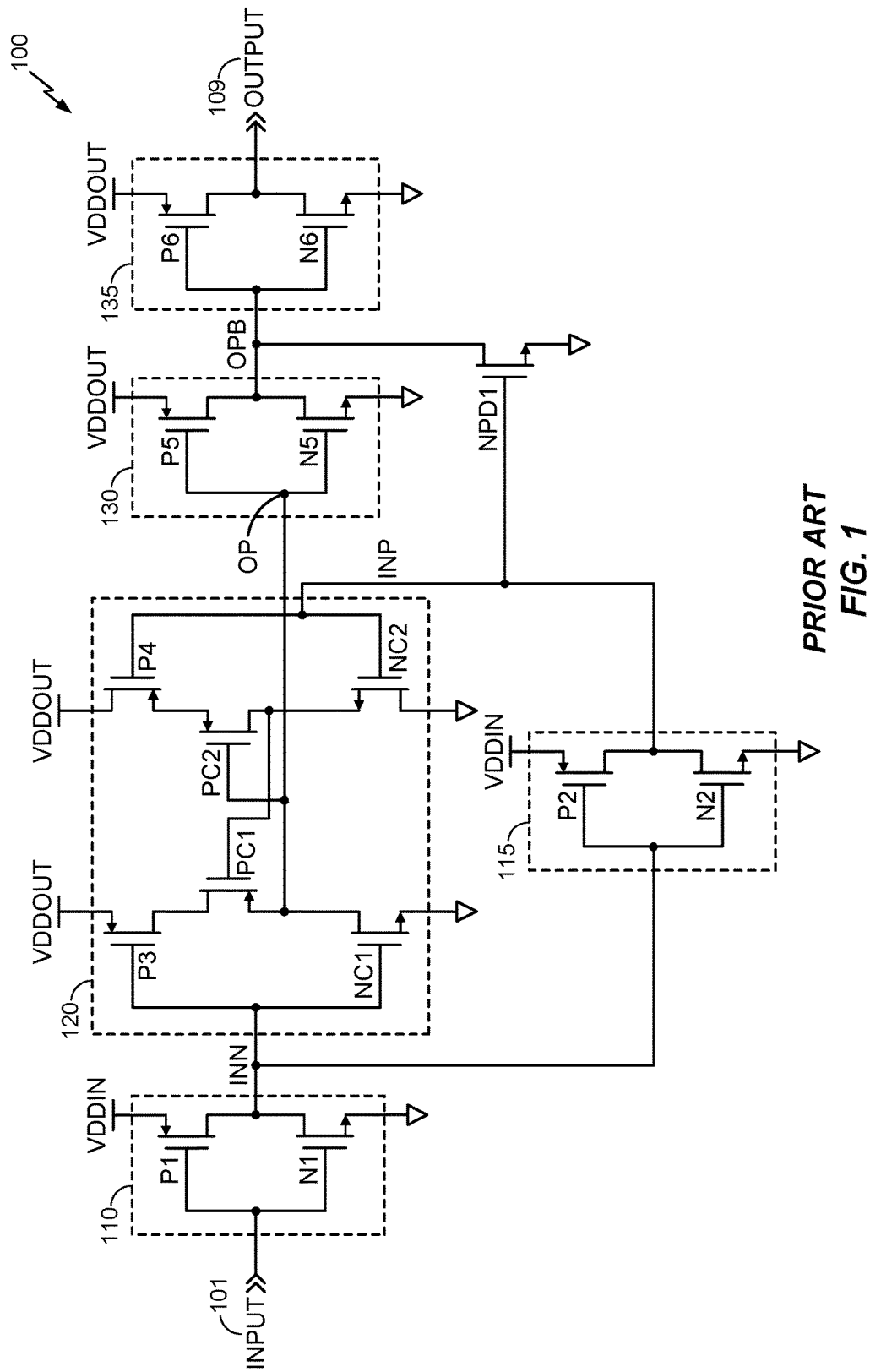
FIG. 1 is a conventional level shifter.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

As discussed above, a level shifter can convert an input logic voltage from a first power domain to a second power domain. In other words, the level shifter is typically configured to receive an input signal in the first power domain and then generates an output signal in the second power domain, where the output signal corresponds to the input signal. For example, when the input signal rises from a logical zero (a.k.a. low voltage level) to a logical one (a.k.a. high voltage level) in the first power domain, the output signal, in response, also rises from a logical zero to a logical one in the second power domain. The time it takes from the input signal rising to the output signal rising is generally referred to as the rise time, the rise delay, or the rise path delay. As such, these terms are used interchangeably throughout the description. Likewise, when the input signal falls from a logical one to a logical zero in the first power domain, the output signal, in response, also falls from a logical one to a logical zero in the second power domain. The time it takes from the input signal falling to the output signal falling is generally referred to as the fall time, the fall delay, or the fall path delay. As such, these terms are used interchangeably throughout the description.

In conventional level shifters, mismatch of rise delay and fall delay is a serious issue. It is important for the rise delay and the fall delay to match each other as close as possible. When there is significant mismatch of the rise delay and the fall delay, the ratio of the time the input signal being at the low voltage level to the time the input signal being at high voltage level in the first power domain would be different from the ratio of the time the output signal being at the low voltage level to the time the output signal being at high voltage level in the second power domain. As a result, the duty cycle (which is typically defined as the percentage of time a signal is at a high voltage level in one period) of the input signal would be different from the duty cycle of the output signal. This is commonly referred to as duty cycle distortion. Such duty cycle distortion is worsened when there is wide voltage differential. Duty cycle distortion often contributes to timing error in semiconductor circuits. This issue is further explained with reference to FIG. 1 below.

To reduce duty cycle distortion, techniques to reduce mismatch of rise delay and fall delay in level shifters are disclosed herein. In some implementations, a switch controlled directly by the input signal is added to cut off voltage supply to a first pull-up transistor in the output stage of the level shifter so that a gate of a second pull-up transistor in the output stage can start being discharged more effectively. By speeding up the discharge of the gate of the second pull-up transistor in the output stage, without waiting for other nodes within the level shifter to resolve their respective logic value, the mismatch of the rise delay and the fall delay can be reduced. More details of the techniques to reduce mismatch of the rise delay and fall delay are further discussed below with reference to FIGS. 2-5.

FIG. 1 illustrates a conventional level shifter. The level shifter 100 includes an input stage having two inverters 110 and 115, a latch 120, and an output stage having two inverters 130 and 135. Inverters 110 and 115 are both in a first power domain associated with a first voltage supply VDDIN. Latch 120 and inverters 130 and 135 are in a second power domain associated with a second voltage supply VDDOUT. VDDIN may be lower than VDDOUT.

As shown in FIG. 1, an input signal INPUT 101 to level shifter 100 is first provided to inverter 110. The output of inverter 110 is coupled to the input of inverter 115 and a first input of latch 120 at the node INN. The output of inverter 115 is coupled to a second input of latch 120 at the node INP. A gate of a discharge switch NPD1 is also coupled to the node INP. An output of latch 120 is coupled to the input of inverter 130 at node OP. An output of inverter 130 is coupled to an input of inverter 135 at node OPB. The drain of NPD1 is also coupled to OPB, whereas the source of NPD1 is coupled to ground. The output of inverter 135 produces the output of level shifter 100.

Latch 120 includes a first set of sequentially coupled pull-up transistor PC1 and pull-down transistor NC1, cross coupled to a second set of sequentially coupled pull-up transistor PC2 and pull-down transistor NC2 to generate a positive feedback loop. PC1 and PC2 are coupled to the second voltage supply VDDOUT via transistor P3 and transistor P4, respectively.

In general, a fall path of a level shifter is the signal path through which a falling edge of an input signal can propagate to an output terminal of the level shifter. Likewise, a rise path of a level shifter is the signal path through which a rising edge of an input signal can propagate to the output terminal. In level shifter 100, a fall path is through P1, NC1, P5, and N6. Specifically, when INPUT falls, P1 is turned on, pull up the voltage at INN and turning on NC1. When NC1 is turned on, the voltage at the drain of NC1 (which is connected to node OP) is pulled down to ground. A low voltage at OP turns on P5, thus pulling up the voltage at node OPB. A high voltage at OPB turns on N6, which pulls OUTPUT down to the ground. Note that the fall path does not include feedback path through inverter 115 (which comprises transistors P2 and N2). In other words, N6 needs not wait for PC1 to turn off and PC2 to turn on.

In contrast, a rise path in level shifter 100 is different from the fall path discussed above. The rise path in level shifter 100 is through N1, P2, NC2, PC1, N5, and P6. Specifically, when INPUT rises, N1 is turned on, pulling the voltage at INN down to ground. A low voltage at INN turns on P2 in inverter 115, resulting in a high voltage at the output of inverter 115, i.e., node INP. A high voltage at INP turns on NC2, causing the voltage at the source of NC2 to go low. Since the source of NC2 is connected to the gate of PC1, PC1 is turned on in response to the source voltage of NC2 going low. As mentioned above, the voltage at INN has gone low. Since INN is also coupled to P3, P3 is turned on in response to the voltage at INN going low. With both P3 and PC1 turned on, the source voltage of PC1 is pulled high (to VDDOUT). The source of PC1 is connected to the gate of N5. So N5 is turned on when the source voltage of PC1 is pulled high. When N5 is turned on, the voltage at OPB is pulled down, which in turn activating P6. When P6 is turned on, OUTPUT is pulled high to VDDOUT. Thus, inverters 130 and 135 in the output stage have to wait for PC1 to turn on and PC2 to turn off before OUTPUT can be pulled high. This rise and fall path difference results in duty cycle distortion.

To speed up rise delay, a bypass switch NPD1 is used in level shifter 100. NPD1 can be an n-type transistor (such as an n-type metal oxide semiconductor (NMOS) device) having a gate, a source, and a drain. The gate of NPD1 is connected to the node INP, the drain of NPD1 is connected to the node OPB, and the source of NPD1 is connected to ground. NPD1 bypasses NC2 and PC1 so that OUTPUT can be toggled through NPD1 and P6. But unless P5 is turned off through NC2 and PC1, NPD1 may need to fight with P5 and slow down discharging at OPB, which eventually slows down the rise of OUTPUT. This issue becomes severe when output voltage is higher than input voltage, which makes P5 stronger and NPD1 weaker so that P5 can then overcome NPD1 and hold the voltage at node OPB at high level until PC1 turns off P5. To remedy this mismatch of rise delay and fall delay, some implementations of level shifter with additional bypass switches are described below.

Figure 2:
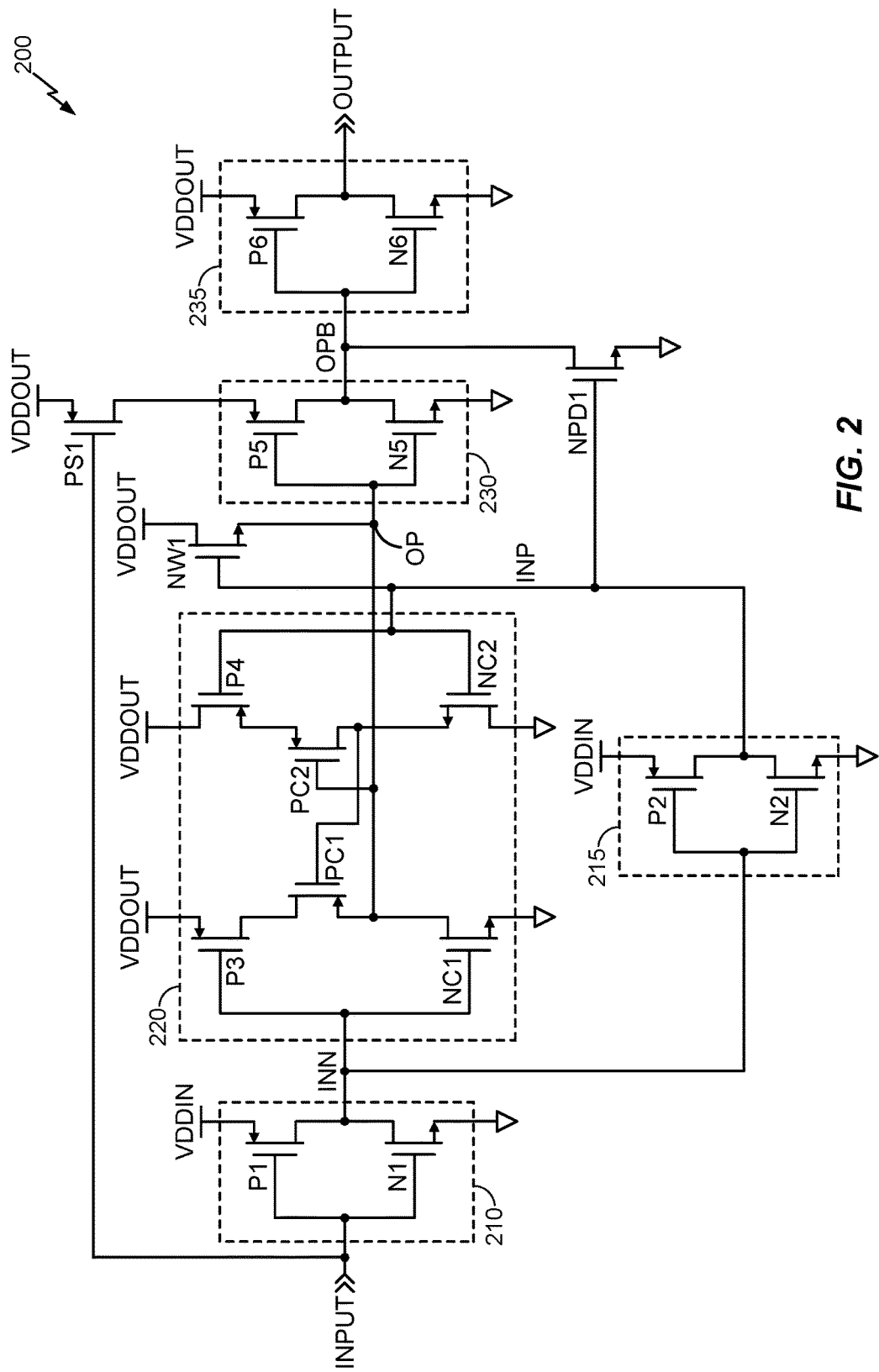
FIG. 2 is one implementation of a level shifter to reduce duty cycle distortion across wide input-output voltage differential range.

FIG. 2 illustrates one implementation of a level shifter to reduce duty cycle distortion across wide input-output voltage differential range. In particular, level shifter 200 is effective in reducing rise delay and fall delay mismatch, especially in high voltage differential application. Like level shifter 100, level shifter 200 includes an input stage having two inverters 210 and 215, a latch 220, an output stage having two inverters 230 and 235, and bypass switch NPD1. Inverters 210 and 215 are both in a first power domain associated with a first voltage supply VDDIN. Latch 220 and inverters 230 and 235 are in a second power domain associated with a second voltage supply VDDOUT. VDDIN may be lower than VDDOUT. Latch 220 includes a first set of sequentially coupled pull-up transistor PC1 and pull-down transistor NC1, cross coupled to a second set of sequentially coupled pull-up transistor PC2 and pull-down transistor NC2 to generate a positive feedback loop. PC1 and PC2 are coupled to the second voltage supply VDDOUT via transistor P3 and transistor P4, respectively. In addition, level shifter 200 further includes two more switches, namely, PS1 and NW1.

In some implementations, PS1 is a p-type transistor having a gate, a source, and a drain. The gate of PS1 is directly connected to the input terminal to receive INPUT. The source of PS1 is connected to VDDOUT, and the drain of PS1 is connected to the source of P5. In some implementations, NW1 is an n-type transistor having a gate, a source, and a drain. The gate of NW1 is connected to node INP, the drain of NW1 is connected to VDDOUT, and the source of NW1 is connected to node OP.

The fall path of level shifter 200 remains substantially similar to the fall path of level shifter 100. But the rise path of level shifter 200 is quite different from the rise path of level shifter 100. In some implementations, means for reducing mismatch of rise delay and fall delay of level shifter 200 is added. The means for reducing mismatch can include switches that help speeding up the rise time of OUTPUT. For instance, although the rise path of level shifter 200 is still through N1, P2, NC2, PC1, N5, and P6, with the addition of PS1 and NW1, P6 can start discharging without waiting for PC1 to turn on as explained below. As a result, the rise delay of level shifter 200 can be significantly reduced. As shown in FIG. 2, INPUT is directly connected to the gate of PS1, and hence, PS1 is directly controlled by INPUT. PS1 can be implemented with a p-type transistor. When INPUT goes high, PS1 is turned off substantially immediately. The drain of PS1 is connected to the source of P5. Therefore, the power supply to P5 is cut off when PS1 is turned off. With the power supply to P5 cut off, NPD1 can discharge the gate of P6 of inverter 235 in the output stage more effectively and quickly, without waiting for PC1 and NC2 in latch 220 to resolve. As a result, P6 can be turned on faster, and hence, OUTPUT, which is at the drain of P6, can be pulled up more quickly.

To further reduce rise delay, NW1 is used to pull up the voltage at node OP. In some implementations, NW1 is a weak n-type transistor. In operation, with INPUT going high, the output of inverter 210 (i.e., node INN) goes low. The signal propagates from node INN through inverter 215 to produce a high voltage at the output of inverter 215, i.e., node INP. Since the gate of NW1 is also connected to node INP, NW1 will be turned on, thus, pulling up the drain voltage of NW1 at node OP. This ensures that the voltage at OP does not go below 0V due to capacitive Miller coupling, which would have strengthened P5 making it contend with NPD1, slowing the discharge of OPB. This low voltage at OPB will turn on P6 to initiate charging of OUTPUT. As such, the addition of NW1 provides a bypass to further reduce the rise delay of level shifter 200 especially when the input transition times are large, delaying turning off PS1. Thus, NW1 is also referred to as a bypass switch and works synergistically with PS1.

Figure 3:
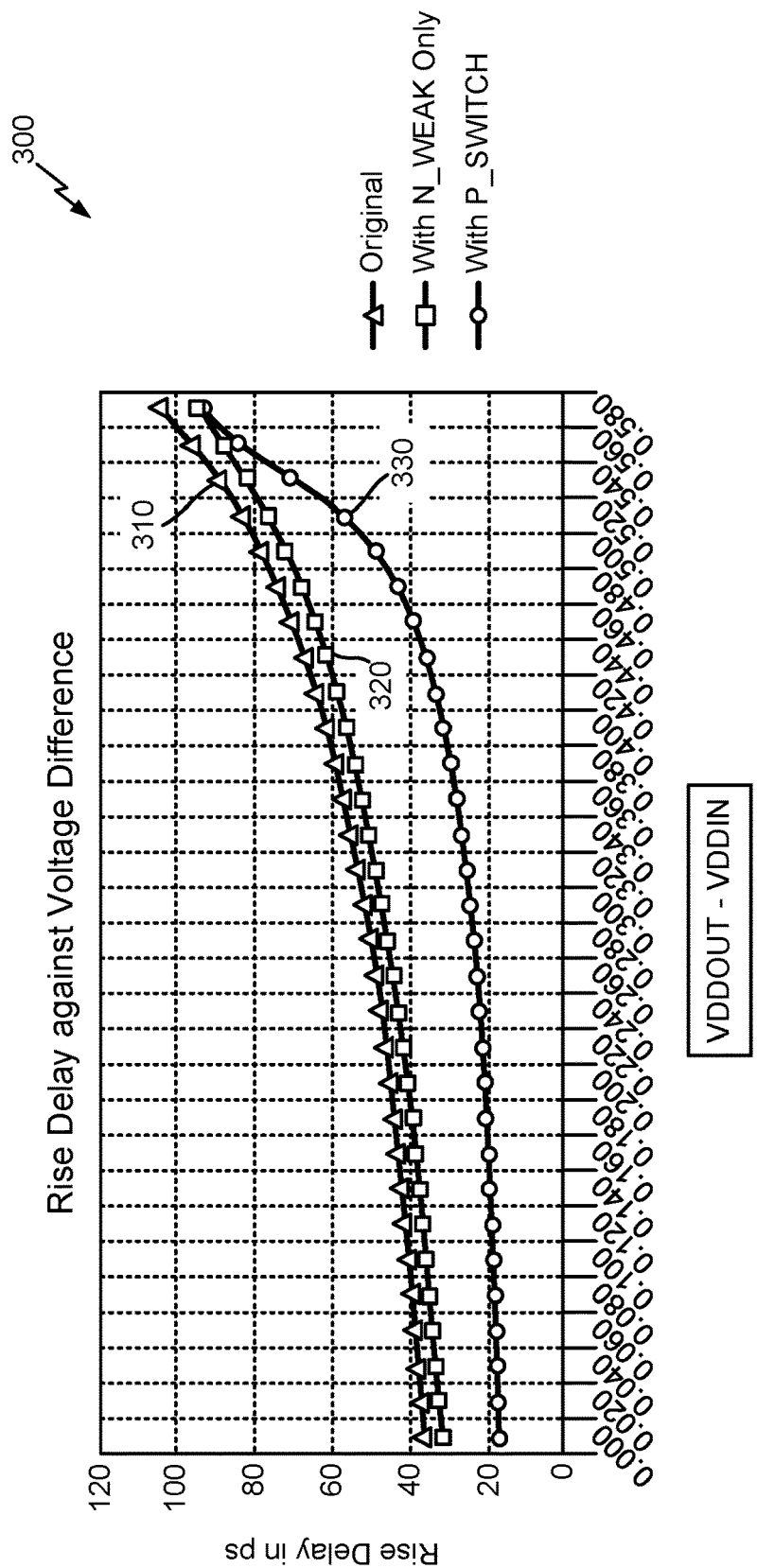
FIG. 3 is a graph illustrating the rise delay of one implementation of level shifter 200 across a wide range of input-output differential voltages.

FIG. 3 is a graph illustrating the rise delay of one implementation of level shifter 200 across a wide range of input-output differential voltages. In graph 300, rise delay in picosecond (ps) is on Y axis and voltage difference is on X axis with output voltage fixed at about 1.05 V and input voltage varying from low to high voltage. Curve 310 shows the rise delay of one implementation of the conventional level shifter 100. Curve 320 shows the rise delay of one implementation of the improved level shifter having bypass switch NW1, which is slightly better than the rise delay in the conventional level shifter 100. Curve 330 shows the rise delay of one implementation of the improved level shifter 200 having both bypass switch NW1 and switch PS1, which is about half of the rise delay of the conventional level shifter 100. Therefore, improved level shifter 200 with both bypass switch NW1 and switch PS1 significantly improves clock latency in many semiconductor circuits as most of today's semiconductor circuit design are positive edge triggered.

Figure 4:
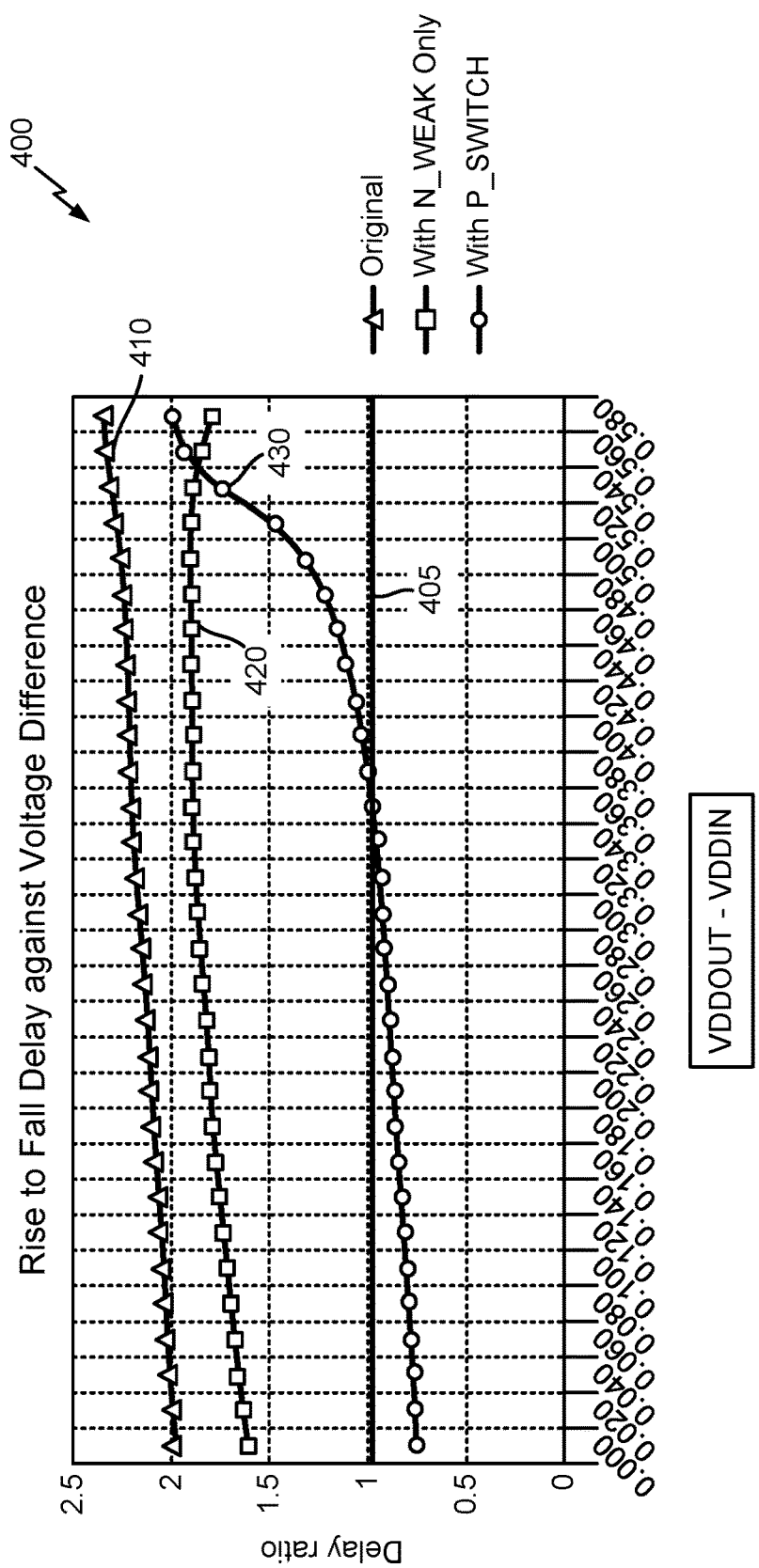
FIG. 4 is a graph illustrating the rise to fall delay ratio of one implementation of level shifter 200 across a wide range of input-output differential voltages.

With reduction in rise delay, the mismatch of rise delay and fall delay is also improved because rise path takes longer than fall path as explained above. FIG. 4 is a graph illustrating the rise to fall delay ratio of one implementation of level shifter 200 across a wide range of input-output differential voltages. In graph 400, rise to fall delay ratio is on Y axis and voltage difference is on X axis with output voltage fixed at about 1.05 V and input voltage varying from low to high voltage. To clear up duty cycle distortion, the delay ratio should ideally be 1, as indicated by the horizontal line 405 across graph 400.

As shown by curve 410 in graph 400, rise delay 410 is more than two (2) times of fall delay in one implementation of conventional level shifter 100. In one implementation of the improved level shifter having bypass switch NW1, as indicated by curve 420, the mismatch of rise delay and fall delay can be improved but still not significant enough. In one implementation of the improved level shifter 200 having PS1 switch, as indicated by curve 430, the rise to fall delay ratio can be significantly improved to close to 1 for a wide range of voltage difference. As such, duty cycle distortion is significantly reduced, if not eliminated, by adoption of some implementations of the improved level shifter 200.

The reduction or elimination of duty cycle distortion of level shifter 200 is quite advantageous in semiconductor circuit design, especially in circuits that has tight timing requirements, such as clock trees and/or clock paths in low-power high-speed applications. For example, in many SoC designs, a clock tree or clock path can span across many power domains within the SoC, thus, requiring the use of many level shifters within the clock tree or clock path. By adopting some implementations of level shifter 200, duty cycle distortion of clock signals propagating down the clock tree or clock path can be significantly reduced. Therefore, the integrity of the clock signal is less likely to deteriorated as the clock signal propagates further down the clock tree or clock path. This is crucial in meeting the tight timing requirement of many low-power high-speed applications.

Figure 5:
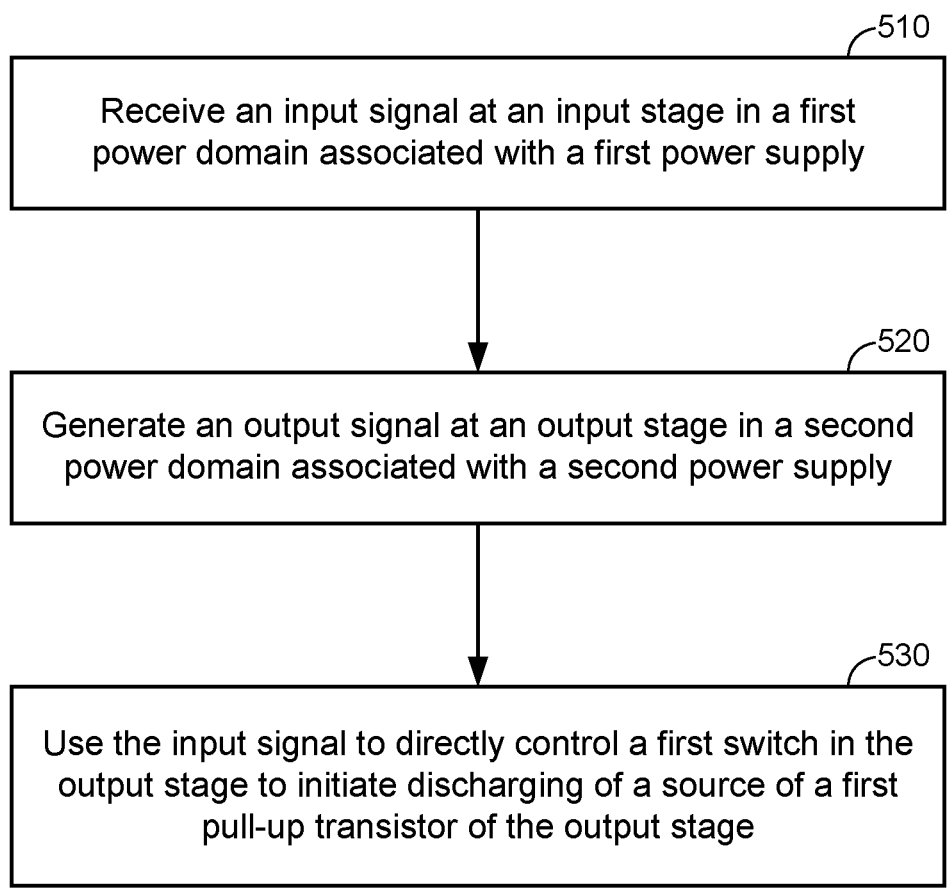
FIG. 5 is one implementation of a process to level shift a signal with reduced duty cycle distortion across wide input/output voltage operation range.

FIG. 5 illustrates one implementation of a process to level shift a signal with reduced duty cycle distortion across wide input/output voltage operation range. The process can be performed using some implementations of level shifter 200 described above. The process begins at block 510, where an input signal is received at an input stage of a level shifter in a first power domain associated with a first power supply. Then the process transitions to block 520, in which an output signal at an output stage of the level shifter is generated. The output stage is in a second power domain associated with a second power supply. The process further includes block 530, in which the input signal is used to directly control a first switch in the output stage to enhance discharging of a source of a first pull-up transistor of the output stage. For example, the first switch can be PS1 in FIG. 2, which is directly controlled by INPUT. When INPUT goes high, PS1 is turned off, thus cutting off the power supply to P5. Without P5 fighting against NPD1, NPD1 can discharge P6 in the output stage of level shifter 200 more effectively.

The previous description is provided to enable any person skilled in the art to practice the various implementations described herein. Various modifications to these implementations will be readily apparent to those skilled in the art, and the generic principles defined herein may be applied to other implementations. Thus, the claims are not intended to be limited to the implementations shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any implementation described herein as "exemplary" is not necessarily to be construed as preferred or advantageous over other aspects. Unless specifically stated otherwise, the term "some" refers to one or more. All structural and functional equivalents to the elements of the various implementations described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:
1. A level shifter, comprising:
   an input stage coupled to a first power supply of a first power domain to receive an input signal;
   an output stage coupled to a second power supply of a second power domain to generate an output signal;
   a first switch coupled directly between the output stage and the second power supply, wherein the input signal controls the first switch to enhance discharging of a source of a first pull-up transistor of the output stage;
   a latch in the second power domain, the latch being coupled between the input stage and the output stage; and
   a bypass switch coupled between the output stage and the latch, wherein the bypass switch is controlled by a delayed version of the input signal to initiate charging of a gate of the first pull-up transistor of the output stage.
2. The level shifter of claim 1, wherein the first switch has a gate, a source, and a drain, the source being coupled to the second power supply, the drain being coupled to the output stage, and the gate being driven directly by the input signal.
3. The level shifter of claim 2, wherein the first switch comprises a first p-type transistor.
4. The level shifter of claim 3, wherein the output stage comprises:
   a second p-type transistor having a gate, a source, and a drain, the source of the second p-type transistor coupled to the drain of the first p-type transistor; and
   a first n-type transistor having a gate, a source, and a drain, the gate of the first n-type transistor coupled to the gate of the second p-type transistor, and the drain of the first n-type transistor coupled to the drain of the second p-type transistor.

5. The level shifter of claim 4, wherein the first switch is configured to turn on and to cause the second p-type transistor to start charging in response to the input signal going low.

6. The level shifter of claim 1, wherein the bypass switch has a gate, a source, and a drain, the drain being coupled to the second power supply, the source being coupled to an input of the output stage, and the gate being coupled to the latch.

7. The level shifter of claim 6, wherein the input stage comprises:
   a first inverter having an input and an output, wherein the input is configured to receive the input signal; and
   a second inverter having an input and an output, wherein the input of the second inverter is coupled to the output of the first inverter, and the output of the second inverter is coupled to the gate of the bypass switch.

8. The level shifter of claim 7, wherein the bypass switch comprises an n-type transistor.

9. The level shifter of claim 1, wherein the first power supply is lower than the second power supply.

10. A method to level shift an input signal, comprising:
    receiving the input signal at an input stage in a first power domain associated with a first power supply;
    generating an output signal at an output stage in a second power domain associated with a second power supply;
    using the input signal to directly control a first switch in the output stage to enhance discharging of a source of a first pull-up transistor of the output stage;
    providing a latch in the second power domain to store a value corresponding to the input signal; and
    using a delayed version of the input signal to control a bypass switch to initiate charging of a gate of the first pull-up transistor of the output stage.

11. The method of claim 10, wherein the first switch comprises a p-type transistor having a gate, a source, and a drain, and using the input signal to directly control the first switch comprises applying the input signal to the gate of the p-type transistor.

12. The method of claim 11, further comprising coupling the source of the p-type transistor to the second power supply.

13. The method of claim 10, wherein the first power supply is lower than the second power supply.

* * * * *